US011190194B2

United States Patent
Wicpalek et al.

(10) Patent No.: US 11,190,194 B2
(45) Date of Patent: Nov. 30, 2021

(54) METHOD AND APPARATUS FOR IMPROVED DPLL SETTLING AND TEMPERATURE COMPENSATION ALGORITHMS USING SECOND OPEN LOOP OSCILLATOR TUNING FIELD

(71) Applicant: Apple Inc., Cupertino, CA (US)

(72) Inventors: Christian Wicpalek, Puchenau (AT); Andreas Roithmeier, Munich (DE); Andreas Leistner, Grasbrunn (DE); Thomas Gustedt, Munich (DE); Herwig Dietl-Steinmaurer, Wels (AT); Tobias Buckel, Linz (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/977,582

(22) PCT Filed: Mar. 31, 2018

(86) PCT No.: PCT/US2018/025598
§ 371 (c)(1),
(2) Date: Sep. 2, 2020

(87) PCT Pub. No.: WO2019/190567
PCT Pub. Date: Oct. 3, 2019

(65) Prior Publication Data
US 2021/0013891 A1    Jan. 14, 2021

(51) Int. Cl.
*H03L 7/099*    (2006.01)
*H03L 7/093*    (2006.01)

(52) U.S. Cl.
CPC ............. *H03L 7/099* (2013.01); *H03L 7/093* (2013.01); *H03L 7/0991* (2013.01); *H03L 2207/06* (2013.01)

(58) Field of Classification Search
CPC ..... H03L 7/099; H03L 7/093; H03L 2207/06; H03L 1/022; H03L 7/0991
See application file for complete search history.

(56) References Cited

U.S. PATENT DOCUMENTS

| 6,545,545 | B1  | 4/2003 | Fernandez-Texon |
| 6,597,249 | B2* | 7/2003 | Chien ................. H03L 7/099 327/147 |
| 2012/0195239 | A1 | 8/2012 | Belitzer et al. |
| 2016/0182065 | A1 | 6/2016 | Wicpalek et al. |

OTHER PUBLICATIONS

International Search Report dated Jul. 30, 2018 for International Application No. PCT/US2018/025598.

* cited by examiner

*Primary Examiner* — Jung Kim
(74) *Attorney, Agent, or Firm* — Eschweiler & Potashnik, LLC

(57) ABSTRACT

A digital phase-locked loop has a digitally controlled oscillator with a first coarse tuning field for coarse tuning of the oscillator frequency, a second coarse tuning field for tuning of the oscillator frequency at finer intervals than the first coarse tuning field, and a fine tuning field for tuning the oscillator to an output frequency at finer intervals than the second coarse tuning field. The second coarse tuning field provides open loop tuning and is linear and connected parallel to the first coarse tuning field. The second coarse tuning field provides wide field temperature compensation and frequency error determination at start up based on an interpolated frequency value obtained prior to start up. Faster settling is provided with less complex algorithms.

16 Claims, 7 Drawing Sheets

METHOD AND APPARATUS FOR IMPROVED DPLL SETTLING AND TEMPERATURE COMPENSATION ALGORITHMS USING SECOND OPEN LOOP OSCILLATOR TUNING FIELD

This application is a National Phase entry application of International Patent Application No. PCT/US2018/025598 filed on Mar. 31, 2018 and is hereby incorporated by reference in its entirety.

TECHNICAL FIELD

The present disclosure relates generally to a method and a phase-locked loop apparatus, and more particularly to a method and apparatus for frequency settling or temperature coverage in a phase-locked loop.

BACKGROUND

For phase-locked loop (PLL) circuits, including digital phase-locked loop (DPLL) circuits which are used in cellular communications systems and in connectivity applications, a short settling time and wide temperature coverage are preferred.

A PLL is an electronic circuit that tunes an oscillator so that the oscillator adjusts its output to match a desired frequency, and may be used to demodulate, modulate or recover a signal, for example. Some currently used digital-controlled oscillators (DCOs) have a coarse tuning (CT) field and a fine tuning (FT) field for tuning the oscillator to the target frequency. The coarse tuning (CT) field is used for coarse frequency setting of the oscillator and can be used for temperature compensation. The coarse tuning field consists of binary switched capacitors that each provide a tuning characteristic defined by its integral nonlinearity (INL) 1/sqrt(LC). The coarse tuning field is operated using an open loop operation which means that the control loop is open. Due to process variations, the capacitors are not perfectly matched. Any mismatches between the capacitors result in discontinuities in the overall tuning characteristic of the coarse tuning field. To avoid gaps in the operating frequency, the coarse tuning field is designed with overlaps in the tuning characteristics of the capacitors to provide a margin for any mismatches that are the result of process variations. The magnitude of the overlaps vary. As a result of the overlaps in the tuning characteristics, the coarse tuning field may be described as non-linear.

The fine tuning (FT) field provides fine adjustment of the oscillator frequency for PLL locking. The fine tuning field is used in a closed loop operation, meaning that the fine tuning field is driven by a loop filter. The fine tuning field has a more linear tuning characteristic than the coarse tuning field since it has smaller discontinuities in the tuning characteristic. The fine tuning field is thermometer coded or arranged in an array to achieve linear behavior.

The term settling when applied to the oscillator refers to the time required for the PLL circuit to lock onto a frequency. Two ways that settling has been achieved include a first method that uses a binary successive approximation algorithm using the coarse tuning (CT) field in the oscillator for the initial DCO (digitally controlled oscillator) frequency setting. This first method needs several frequency measurements during the PLL power up to work. A second method uses a fast band selection algorithm which utilizes an interpolation in combination with up to two frequency measurements during the PLL power up. Both methods have disadvantages because both methods need two or more frequency measurements during the PLL power up, which increase the locking time for the PLL. In other words, the time for the oscillator to settle onto the desired frequency is longer.

Use of the phase-locked loop apparatus over a range of temperatures raises other issues. Changes in temperature may lead to changes in the oscillator's operation point. The temperature drift that occurs in the oscillator may be compensated by the FT (fine tuning) field, which automatically changes the operation point of the oscillator as the temperature changes. But the FT (fine tuning) field has a limited range over which it may compensate for temperature changes. The range over which the fine tuning field may change the operating point may not be big enough to provide temperature compensation over the whole temperature range in which the device may be required to operate.

To provide an extended temperature range, a so-called temperature extension algorithm operates to switch the CT (coarse tuning) field open loop in a way that the FT (fine tuning) field is re-centered. A disadvantage of this approach is that due to the discontinuities in the CT (coarse tuning) field the algorithm that implements the temperature compensation is very complex, requires a lot memory to operate, and requires a lab evaluation, which delays the chip bring-up. Chip bring-up refers to a process that includes assembly, testing, validation and debugging in order to achieve readiness for manufacture.

DETAILED DESCRIPTION

The present method and apparatus provides a digital phase-locked loop (DPLL) apparatus which may have a fast settling time for settling the oscillator at a desired frequency.

The phase-locked loop apparatus uses two coarse tuning fields and a fine tuning field. In particular, a first coarse tuning (CT1) field which is non-linear and a second open loop coarse tuning (CT2) field which is linear and which is parallel to the first coarse tuning (CT1) field are provided. Both tuning fields can be concentrated in one CT field containing a linear part and a nonlinear part.

The second open loop coarse tuning (CT2) field may be used to enable a very fast DPLL settling time by performing a pre-characterization of the CT field before the PLL apparatus power up. In certain aspects, the pre-characterization may include an interpolation function before the PLL apparatus power up. The pre-measurement is done with a frequency counter. The counter counts oscillator edges over an exact defined gating period. The gating period is defined in e.g. reference clock cycles:

$$Tgate=gate/fref$$

resulting in the counter result:

$$Cnt\_result=fdco*Tgate$$

Only one frequency measurement is performed at the power up of the PLL apparatus to determine the frequency error between the frequency determined by interpolating between the determined measurements for the pre-characterization and the current measurement of the frequency of the received signal obtained during the PLL power up. The second linear open loop tuning (CT2) field is used to compensate for the error as a result of the measurement.

Temperature drift compensation is provided in the DPLL apparatus when the FT (fine tuning) field is at its limit due to a temperature drift. The temperature compensation is provided by using the second linear open loop tuning (CT2) field for the temperature drift compensation after large temperature changes and by letting the FT (fine tuning) field re-center after the temperature drift compensation by the CT2 field.

The present method and apparatus provides a phase-locked loop having a much faster locking time and a less complex process to compensate for temperature drift in the oscillator as a result of temperature changes. Only one frequency measurement is needed during the DPLL settling sequence, which reduces the settling time required by the PLL. Providing the second more linear coarse tuning field (beside the conventional non-linear CT field) for use in temperature compensation and for use during settling may result in advantages. The present method and apparatus enables the use of less complex FW (firmware) algorithms, requires less memory usage, requires less verification, utilizes more robust FW (firmware) algorithms, and requires less debugging and permits faster chip bring-up compared to DPLLs of the conventional design.

Figure 1:
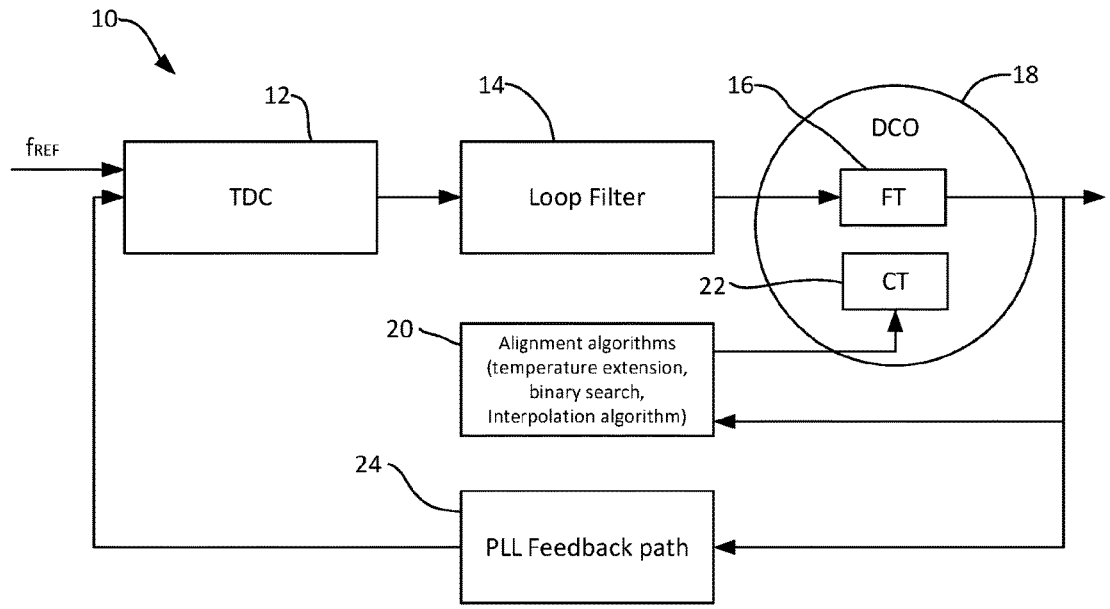
FIG. 1 is a functional block diagram of a conventional phase-locked loop device.

With reference to the drawings, conventional digital PLLs generally have two tuning fields, a fine tuning (FT) field and a coarse tuning (CT) field. An example of a digital phase-locked loop apparatus 10 is shown in FIG. 1. A reference frequency fREF is provided to a TDC (time-to-digital converter) 12, the output of which is provided to a loop filter 14. The loop filter 14 provides its output to a fine tuning field 16 which is part of a digitally controlled oscillator 18. The output of the fine tuning field 16 fine tunes the oscillator to the target frequency and generates an output signal that provide the output of the digitally controlled oscillator (DCO) 18. The output of the DCO is provided as the output of the DPLL 10. The output of the DPLL 10 is provided to an input of an alignment algorithms unit 20. The alignment algorithms unit 20 may include one or more algorithms for processing the signal, including for example a temperature extension algorithm, a binary search algorithm, and an interpolation algorithm. The output of the alignment algorithms unit 20 is provided to the coarse tuning field 22 of the digitally controlled oscillator 18. The coarse tuning field 22 provides a coarse tuning of the oscillator to the desired frequency. The output of the digitally controlled oscillator 18 is provided to a PLL feedback path 24, the output of which is provided to a second input of the TDC 12.

The coarse tuning (CT) field 22 is used to center the DCO 18 frequency as good as possible to the desired target frequency in a coarse tuning. This is done in the conventional DPLL as an open loop operation in the alignment algorithms unit 20 by executing a binary search algorithm or by performing an interpolation between supporting points which were determined in advance by a chip internal measurement e.g. during a chip boot process. The second tuning field or fine tuning (FT) field 16 is used in a closed loop operation and is used for fine tuning the oscillator frequency for locking (settling) the oscillator on the desired frequency and for controlling the PLL 10.

A disadvantage of the conventional open loop alignment/centering methods is the high non-linearity of the CT (coarse tuning) field 22. The non-linearity results in a difference between the target frequency and the DCO 18 output frequency after the open loop adjustment. The frequency difference needs to be compensated by the FT field 16. Using the fine tuning (FT) field to compensate for the frequency differences can result in a longer locking time by the PLL. The frequency mismatch and the need to address it using the fine tuning field reduces the available range of adjustment for other factors that may be addressed by the FT field 16. For example, the fine tuning (FT) field has less available adjustment range for closed loop temperature drift compensation and for compensation of frequency errors which are introduced by other algorithms.

Figure 2:
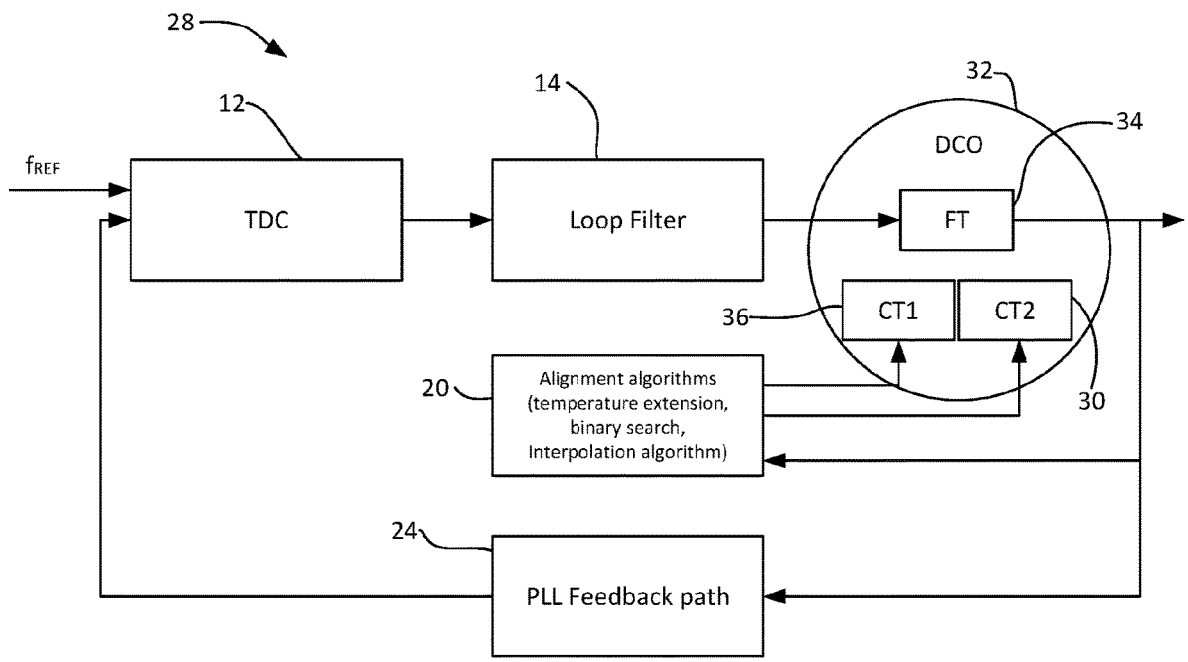
FIG. 2 is a functional block diagram of a phase-locked loop device according to the present method and apparatus.

By contrast to the conventional DPLL, a digital phase-locked loop apparatus 28 according to the present method and apparatus is shown in FIG. 2. The DPLL incorporates a third tuning field (CT2) 30 in the digitally controlled oscillator 32. The third tuning field is a coarse tuning field, more particularly a second coarse tuning field, that is added to the oscillator which also includes a fine tuning field 34 and a first coarse tuning field 36. The third tuning field 30 may be used to improve (decrease) the locking time of the DPLL, may be utilized for extended temperature compensation, and thus may maximize the available operational range of the FT field. The DPLL 28 is otherwise similar to the conventional DPLL 10 shown in FIG. 1, and the same description applies to the like numbered parts. The DPLL apparatus may be implemented using hardware, software, firmware, or a combination thereof. Reference to a DPLL apparatus or DPLL device does not limit the DPLL to a hardware implementation.

In certain aspects, the digital controlled oscillator 32 has two coarse tuning (CT) fields 30 and 36 that may have the following characteristics:

The first coarse tuning (CT1) field 36 may be a nonlinear field which is operable to cover an overall frequency range of the DCO (digitally controlled oscillator) 32 with a coarse step size.

The second coarse tuning (CT2) field may be a linear field which is operable to eliminate residual frequency errors during an initial alignment and to compensate for extended temperature drifts. The second coarse tuning (CT2) field may have a much smaller tuning range than the first coarse tuning (CT1) field since it may be operable to compensate for small frequency deviations during the locking process and for temperature drifts.

In certain examples, the first coarse tuning field may have a range of 1 GHz, the second coarse tuning field may have a range of 300 MHz, and the fine tuning field may have a range of 40 MHz. In certain examples, the fineness of the steps of the CT2 as between the coarse steps of CT1 and the fine steps of FT.

Figure 3:
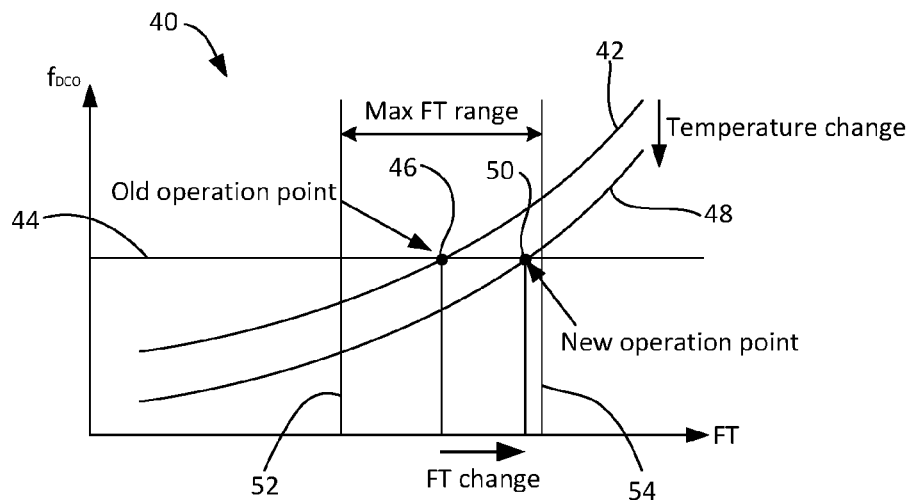
FIG. 3 is a graph showing a change in operating point of a fine tuning (FT) field as a result of a change in temperature.

Turning to FIG. 3, a graph 40 of frequency of the digitally controlled oscillator (DCO) over the fine tuning (FT) field operation shows a first operating curve 42 at a first operating temperature. The DCO operates at a frequency as indicated by a horizontal line 44. The intersection of the DCO frequency with the operating curve 42 at the first operating temperature yields a first operating point 46. In the example, the operating temperature changes, such as the result of a change in the ambient temperature of the DPLL apparatus or a change in heating by components of a device in which the DPLL apparatus is provided. The new temperature yields a new operating curve 48. In order to keep the same DCO frequency, the FT value is shifted to a new operating point 50.

The fine tuning (FT) field has an operating range over which it can compensate for temperature changes. In FIG. 3, the operating range of the fine tuning field is indicated by limit lines 52 and 54. The temperature change indicated by the operating curve 48 has resulted in the new operating point 50 being very close to the limit 54 of the fine tuning field's range. Further temperature changes or other compensation in a right hand direction with reference to the graph would risk the fine tuning field being out of its operating range at 54. For a temperature drift that is greater than the limits 52 and 54, the PLL would be out of lock.

Figure 4:
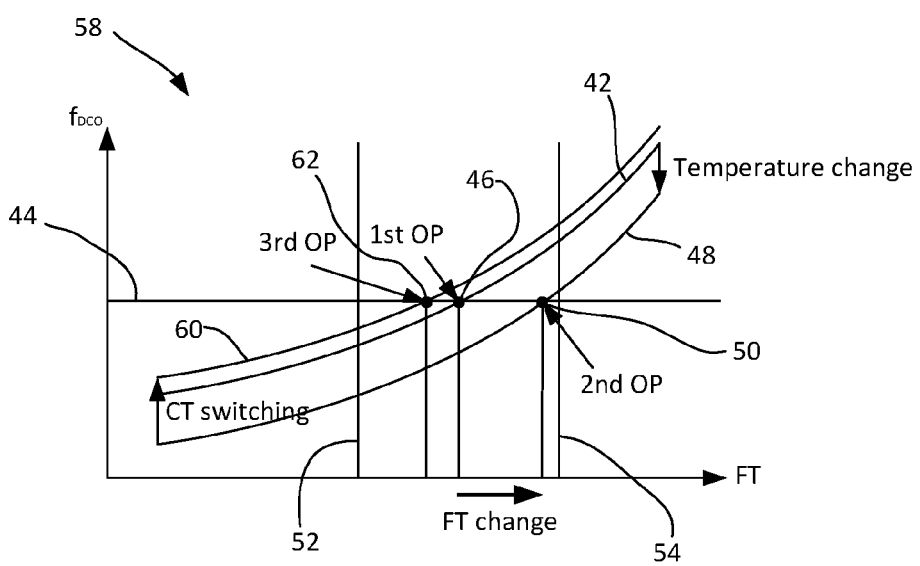
FIG. 4 is a graph showing a change in the operating characteristic as a result of a temperature change and a correction of the temperature induced change in the operating point as a result of either use of a complex algorithm or adding a second coarse tuning (CT) field.

FIG. 4 shows a graph 58 of the DCO frequency over the fine tuning field. The graph shows a shift in the operating point which may result from either the use of the complex algorithm as used in convention systems or which may be the result of a second coarse tuning field CT2. The DPLL operates at a first temperature according to the operating curve 42. A change in the temperature which would have resulted in the operating curve shifting to the operating curve 48 in the conventional DPLL instead results in the operating curve shifting to an adjusted operating curve 60. The adjusted operating curve 60 provides the adjusted operating point 62 at the DCO frequency on the horizontal line 44. The CT switching can be the result of the complex algorithm by switching CT1. However, the simpler solution is to provide the CT switching as a result of switching by the second coarse tuning field CT2. The adjusted operating curve 60 and resulting adjusted operating point 62 is the result of coarse tuning switching (CT switching) using the second coarse tuning (CT2) field. The adjusted operating point 62 is at a position further from the limits 52 and 54 for the fine tuning field. The fine tuning field has a greater capacity to compensate for temperature variations and other factors than if the operating point were at the operating point 50 close to the operating limit 54.

For the temperature coverage, variations in temperature cause the DCO characteristics to drift. To compensate for this effect in the conventional DPLL, the PLL would re-center to a new operation point via the second DCO tuning field (FT) in the closed loop mode when settling. The PLL sets the new operating point automatically when it is locked. Using only the fine tuning FT field for covering a wide temperature range would result in a large fine tuning range for the oscillator, which would very much tighten the DCO design requirements.

In practice, the actual solution used in conventional DPLL devices is to provide tracking of the fine tuning field. If the tuning value reaches a certain threshold, a complex algorithm is triggered which changes the coarse tuning (CT) value in a way that the fine tuning value gets re-centered again. A disadvantage to use of the algorithm is that this coarse tuning field is very nonlinear with several discontinuities in the characteristic. Furthermore, the discontinuities can vary over the process. This results in a complex algorithm, as all of the nonlinearities and discontinuities have to be taken into account by the algorithm for the CT correction.

Figure 5:
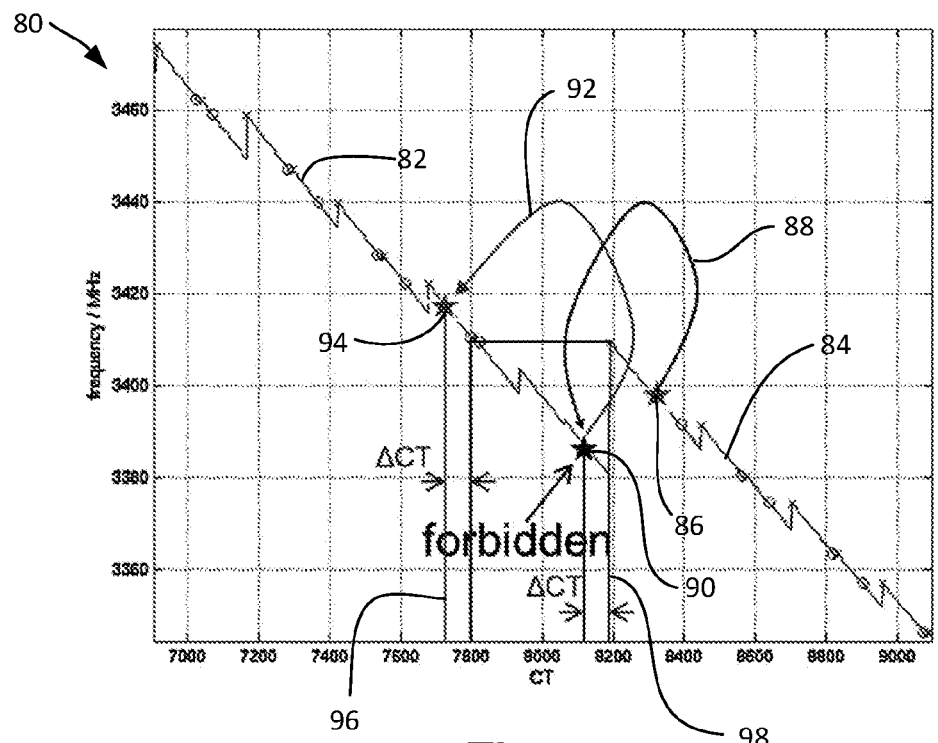
FIG. 5 is a graph showing a typical CT characteristic where a complex CT switching algorithm is used to re-center the operation point of the fine tuning field using a conventional temperature extension.

The handling of the discontinuities during the re-centering process is illustrated in graph 80 in FIG. 5. The graph shows frequency over coarse tuning (CT). The discontinuity in the tuning field operation is apparent from the discontinuity from line 82 to line 84. For example, when the coarse tuning changes along line 84 until it reaches operating point 86, it jumps as shown by arrow 88 to operating point 90. The operating point 90 is forbidden as the DCO frequency would be decreased and not increased as intended—the target operating point would have been 94. The correction algorithm defines a certain number of CT values assuming a linear CT characteristic. For example, the algorithm needs 10 CT values to re-center the FT field. In a linear CT field the 10 CT values would result in an increased frequency. If there is an overlap this 10 CT steps can result in a decreased frequency and therefore no correction is done and the problem is getting worse.

Definition: $\Delta CT = CT\_actual + CT\_step - CT\_overlap$ An example of a correction algorithm that may be used to change the coarse tuning value is described in U.S. Pat. No. 8,890,635. The adjustment is performed during gaps in the transmit operation.

According to the present method and apparatus, a third tuning field (CT2) which is a linear second open loop tuning field is provided. With the second open loop tuning field, it is possible to reduce the complexity of the correction algorithm significantly, because no nonlinear effects have to be considered by the temperature compensation algorithm. Linear correction of temperature changes, which are also linear, are possible with low complexity.

Figure 6:
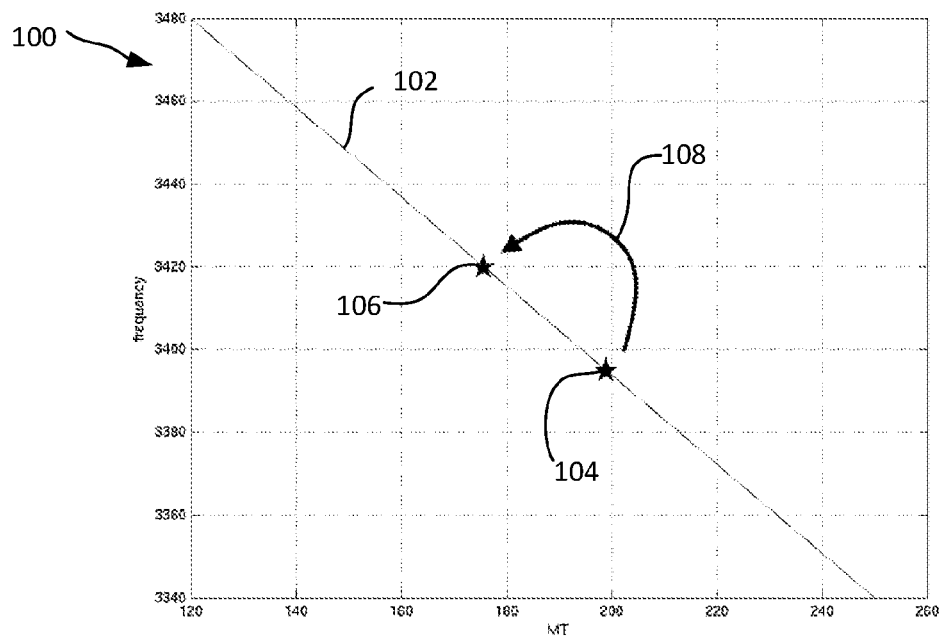
FIG. 6 is a graph showing a correction of a temperature induced change without a discontinuity.

For example, FIG. 6 shows a graph 100 of frequency over CT2 having an operating curve 102. A change from an operating point 104 to an operating point 106 according to the arrow 108 is along the same operating curve 102. Re-centering of the operating point 104 to point 106 occurs without discontinuities. Simplified handling is provided during the re-centering process.

The gradient of the third linear tuning field (CT2) can be determined by pre-measurement before PLL power up.

Figure 9:
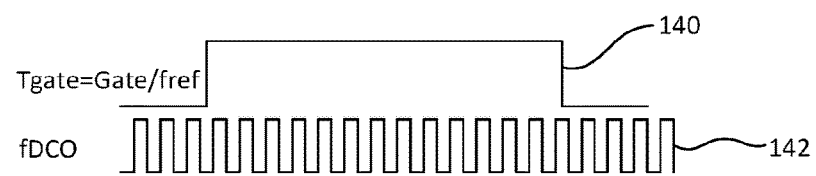
FIG. 9 is a signal diagram showing a gate signal and a clock signal.
Figures 10A, 10B:
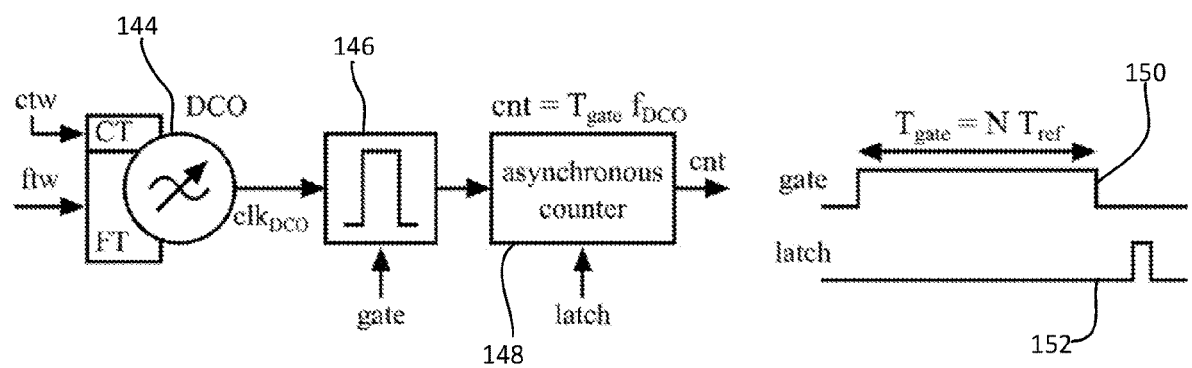
FIG. 10a is a functional block diagram of a counter circuit and FIG. 10b is a signal diagram of a gate and latch signal.

In FIG. 9 is shown a frequency diagram of a gate signal 140 that defines a defined gating period within which reference clock cycles 142 are counted. As shown in FIG. 10a a digitally controlled oscillator 144 has a output that provides a clock signal to a gate 146 and then to an asynchronous counter 148 that provides a count value. The counter result is proportional to the frequency. The pre-measurement is done with the frequency counter 148. The counter 148 counts oscillator edges 142 over an exact defined gating period 140. The gating period 140 is defined in terms of reference clock cycles:

$$T_{gate} = gate / f_{ref}$$

Resulting in the counter result which is proportional to the oscillator frequency $$Cnt\_result = fdco * gate / fref$$

In FIG. 10b, a gate signal 150 has a reference time duration, at the conclusion of which is generated a latch signal 152.

Similar as for the FT field, the second CT field can be characterized by doing a certain amount of frequency measurements (e.g. 3 measurements to account for a quadratic nonlinearity) with the asynchronous counter structure as shown in FIG. 10a.

The present method and apparatus also provides improvements in Fast Band Selection (FBS). A solution for fast band selection in a conventional device is shown in US Published Patent Application No. US 2016/0182065 A1.

The FBS (fast band selection) algorithm is based upon two steps:

1) In a first FW (firmware) or HW (hardware) intensive step, a certain number of DCO frequency measurements for different CT values is done to characterize the DCO CT behavior. This is done for each DCO core separately. During PLL configuration the FW is utilizing those CT measurements, to solve the inverse problem of finding a CT value for which the DCO operates as close as possible to the target frequency by interpolation. To reduce the PLL locking time, the characterization step is executed during chip boot phase.

2) In a second HW (hardware) intensive step performed during the PLL locking process (i.e. PLL power-up), a residual frequency error is further reduced by performing up to two frequency measurements in open loop. The measured frequencies are compared to the target frequency and from the delta frequency a CT step is calculated which is used to reduce the initial frequency error. For the CT step calculation a proper approximation of the CT gradient in the lab (on one chip sample) is required. The measured frequency differences are then used to improve the CT setting from step 1. A proper approximation of the CT gradient in the lab (on one chip sample) is required to enable the correction step to reduce the residual error.

Mainly depending on the CT step size but also on CT overlaps, temperature changes and measurement uncertainties as well as the signal processing itself, the residual frequency error after step 2 can still be in the range of several MHz resulting in a frequency settling process when closing the control loop.

According to the present method and apparatus, by introducing a third (small) tuning field (CT2) with better integral and differential non-linearity compared to what the CT1 field provides, a more accurate adjustment of the DCO frequency in step 2 acting now on the third tuning field can be achieved.

Therefore, the following advantages result:

1) The CT2 field can be characterized in the same way as the FT field (the gain of the field is determined by two frequency measurements).

Figure 7:
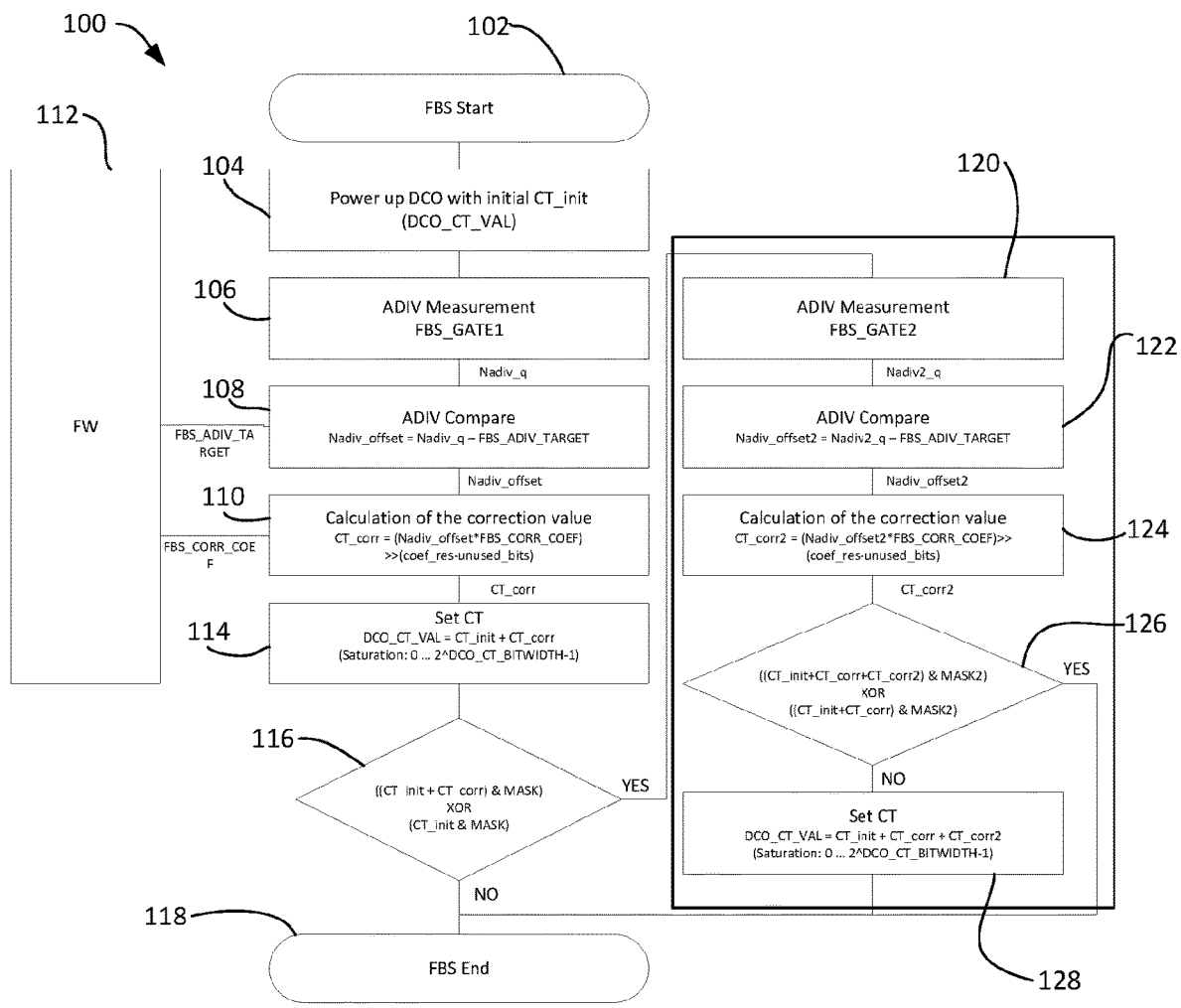
FIG. 7 is a process diagram showing operation of a conventional fast band selection algorithm.

2) Since the CT2 field shows no overlaps, the method and apparatus avoids a possible second frequency measurement in step 2 as shown in FIG. 7. This reduces the timing budget that is accounted for by the FBS during the locking process and reduces complexity of the step 2 algorithm since overlaps don't have to be accounted.

3) The gradient of the linear third tuning field can be also characterized on-chip and applied to the HW (hardware) algorithm in order to enhance the correction accuracy.

4) The lower residual error will result in a lower control loop settling after closing the loop, thus reducing the locking time.

Turning to FIG. 7, a flowchart 100 of a fast band selection algorithm for example as described in US Published Patent Application No. US 2016/0182065 A1 begins at the fast band selection start 102. At 104, the digitally controlled oscillator is powered up with an initial coarse tuning value. At 106, a frequency divider (which may be an adjustment divider or asynchronous divider (ADIV)) performs a frequency measurement with a gating time FBS_GATE1. At 108, the measured frequency value is compared to the target frequency value. At 110, a calculation of a correction value is performed. A firmware (FW) algorithm is used as indicated at 112. The corrected CT value is set at 114. At 116, a determination is made as to whether the set value and a MASK value is different than the initial CT value and a MASK value. If not, then the fast band selection ends at 118. For example, the Mask is used to detect an overlap, whereas Mask gives the number of bits which are considered: e.g. for a 14 bit CT vector using 5 MSBs this would result in: FBS_MASK='11111000000000'.

If the determination at 116 finds that the set value is different, then at 120 a frequency measurement is made with a gating time FBS_GATE2. At 122, a comparison of the measured value is made to the target to find an offset. At 124, a second correction value is calculated, and at 126 a determination is made as to whether the second correction value is different compared to the initial CT value and the first correction value. If the second correction value is different, then the CT value is set to the second correction value at 128 and the process ends at 118. If not different, the process ends at 118.

Figure 8:
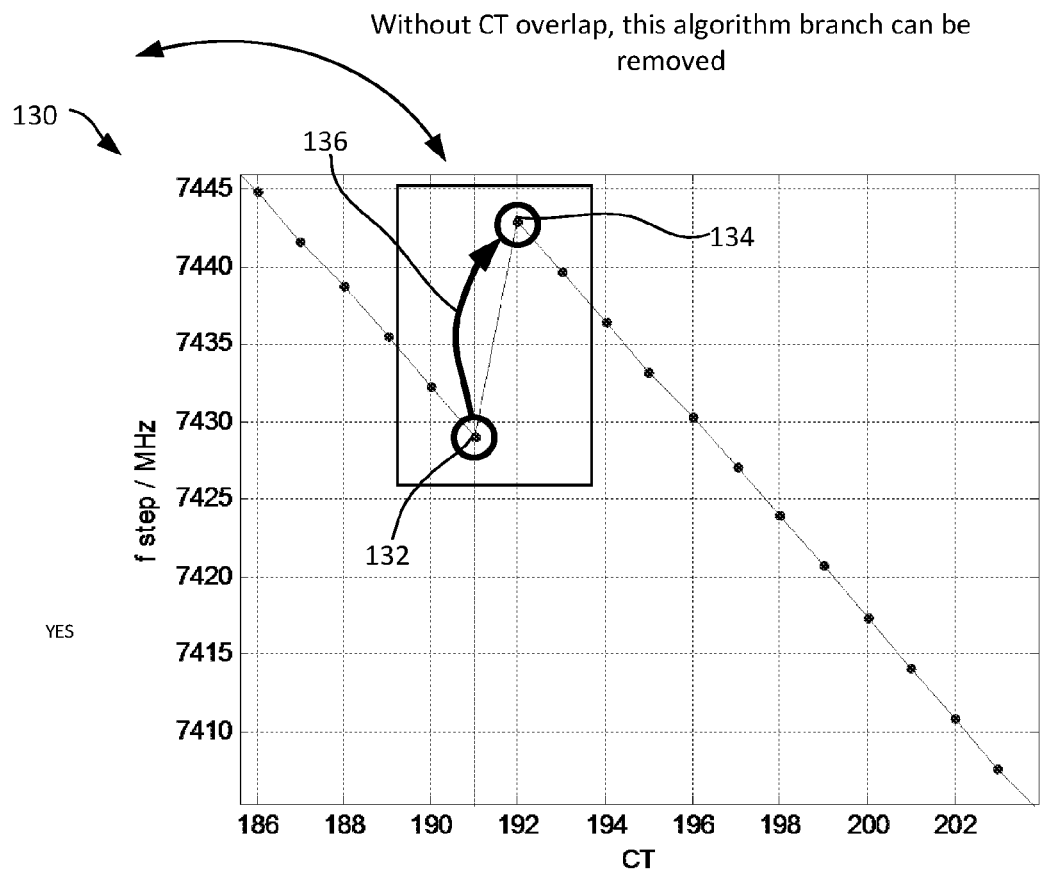
FIG. 8 is a graph showing a fast band selection process step which is not needed for a PLL using a new linear CT field.

FIG. 8 is a graph 130 showing an algorithm branch that can be removed in the absence of the CT overlap. In particular, the graph 130 shows frequency steps over CT. A transition from a CT value as show at 132 to a next CT value at 134 as indicated by arrow 136 occurs without an overlap.

Figure 11:
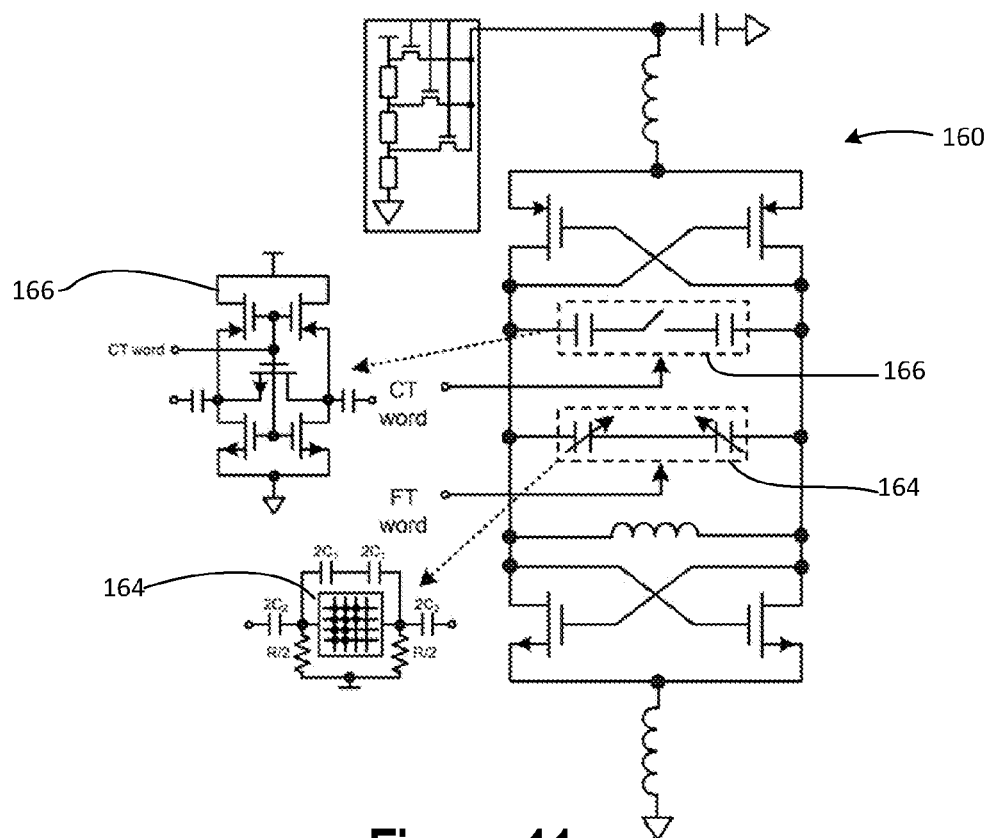
FIG. 11 is a circuit diagram of a phase locked loop circuit including a coarse tuning field and a fine tuning field.
Figure 12:
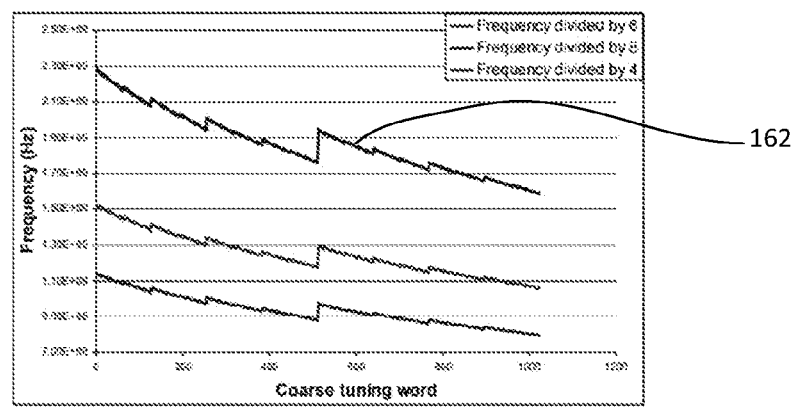
FIG. 12 is a graph of a tuning characteristic of the coarse tuning field.

FIG. 11 provides an example of a conventional oscillator 160 having a unitary weighted fine tuning field 164 and a binary weighted coarse tuning field 166. FIG. 12 shows a graph of the tuning characteristic 162 of the coarse tuning CT field of FIG. 11. The discontinuity is apparent in the characteristic 162. By incorporating a second CT field with less tuning range but a more linear characteristic, the algorithmic overhead and problems arising in case of a temperature compensation by the CT word near the region of the discontinuity, can be avoided.

The tuning of the CT1, CT2 and FT fields can be considered to act separately on the DCO frequency. This is apparent from FIG. 11 wherein both CT and FT fields are connected in the resonating circuit to the same electrical nodes.

The present method and apparatus provides various aspects. In a first aspect, an oscillator for a phase-locked loop, comprising: a nonlinear first coarse tuner configured to receive an input signal having frequency information, provide a coarse frequency setting, and be operable in an open loop operation; a second coarse tuner coupled in parallel with the first coarse tuner, and configured to receive the input signal, and perform a change of an operation point of an oscillator or compensate for a frequency offset; a fine tuner configured to receive the input signal, provide fine adjustments of a frequency of the oscillator, and be operable in a closed loop operation; and an oscillator output configured to output a signal having a frequency determined by the first coarse tuner, the second coarse tuner, and the fine tuner.

In a second aspect, an oscillator according to the first aspect, wherein the first coarse tuner comprises a first tuning range, the second coarse tuner comprises a second tuning range, the second tuning range being smaller than the first tuning range.

In a third aspect, an oscillator according to a first aspect, wherein the first coarse tuner is configured to set the frequency of the oscillator at first frequency intervals, and wherein the second coarse tuner is configured set the frequency of the oscillator at second frequency intervals, the second frequency intervals being smaller than the first frequency intervals.

In a fourth aspect, an oscillator according to a first aspect, wherein the fine tuner is configured to compensate temperature drift by the oscillator over a first temperature range; and wherein the second coarse tuner is configured to re-center an operation point of the fine tuner over a second temperature range, the second temperature range being wider than the first temperature range.

In a fifth aspect, an oscillator according to a first aspect, wherein the second coarse tuner is configured to re-center a tuning frequency of the fine tuner.

In a sixth aspect, an oscillator according to a first aspect, wherein the first coarse tuner and the second coarse tuner are separate tuning fields.

In a seventh aspect, an oscillator according to a first aspect, wherein the first coarse tuner and the second coarse tuner are a respective non-linear part and a linear part of a single coarse tuning field.

In an eighth aspect, an oscillator according to a first aspect, wherein the second coarse tuner is configured to perform a pre-characterization before power-up of the phase-locked loop.

In a ninth aspect, an oscillator according to an eighth aspect, wherein the pre-characterization comprises an interpolation.

In a tenth aspect, an oscillator according to an eighth aspect, further comprising: a frequency counter configured to count a reference clock signal over a gate period.

In an eleventh aspect, an oscillator according to a tenth aspect, wherein the frequency counter is configured to receive a gate signal defining the gate period.

In a twelfth aspect, an oscillator according to an eighth aspect, wherein the first coarse tuner and the second coarse tuner and the fine tuner are configured to output the signal at the oscillator output as a result of a single frequency measurement post phase-locked loop power up.

In a thirteenth aspect, an oscillator according to a first aspect, wherein the oscillator is configured to output a signal based on an alignment algorithm.

In a fourteenth aspect, an oscillator according to a thirteenth aspect, wherein the alignment algorithm includes at least one of a temperature extension algorithm, a binary search algorithm, and an interpolation algorithm.

In a fifteenth aspect, a phase-locked loop apparatus, comprising: a time-to-digital converter having a first input configured to receive an input signal and generate a time-to-digital converter output signal; a loop filter configured to generate a filtered output signal based on the time-to-digital converter output signal; a digitally controlled oscillator configured to generate a phase-locked loop output signal based on the filtered output signal; a feedback path coupled between an output of the digitally controlled oscillator and a second input of the time-to-digital converter; wherein the digitally controlled oscillator includes: a first coarse tuner configured to provide coarse frequency setting of the oscillator and be operable in an open loop operation, wherein the first coarse tuner is non-linear; a second coarse tuner coupled in parallel with the first coarse tuner, and configured to perform a change of an operation point of the oscillator or to compensate for a frequency offset, wherein the second course tuner is linear; a fine tuner configured to provide fine adjustments of the frequency of the oscillator, and be operable in a closed loop operation; and an oscillator output configured to output a signal having a frequency determined by the first coarse tuner, the second coarse tuner, and the fine tuner.

In a sixteenth aspect, a phase-locked loop apparatus according to the fifteen aspect, further comprising: a frequency measurer configured to perform a single open loop frequency measurement after a phase-locked loop power up to compensate for any frequency mismatch using the second coarse tuner; wherein the oscillator is further configured to settle on a frequency after the single frequency measurement post the phase-locked loop power up.

In a seventeenth aspect, a method for setting a frequency of an oscillator, comprising: setting, by a non-liner open-loop first course tuner, a first course frequency of the oscillator based on a frequency of a reference signal; determining, by a linear second course tuner, a first error between the first coarse frequency and the frequency of the reference signal; changing an operating point of the oscillator based on the first error; measuring, by a closed loop fine tuner, a second error; and setting the frequency of the oscillator based on the second error.

In an eighteenth aspect, a method according to the seventeenth aspect, further comprising: compensating, by the second course tuner, for temperature changes of the oscillator.

In a nineteenth aspect, a method according to the seventeenth aspect, further comprising: interpolating frequency values prior to a power up of a phase-locked loop to obtain an interpolated frequency; powering up the phase-locked loop; determining a frequency measurement of the reference signal at power up of the phase-locked loop to obtain a measured frequency; determining a measured error between the interpolated frequency and the measured frequency; and compensating for the measured error by the second coarse tuner.

In a twentieth aspect, a method according to the seventeenth aspect, wherein the first coarse tuner determines the first coarse frequency setting at a first frequency interval; wherein the second coarse tuner determines the second coarse frequency setting at a second frequency interval that is smaller than the first frequency interval; and wherein the fine tuner determines the fine frequency setting at a third frequency interval that is smaller than the second frequency interval.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

We claim:

1. An oscillator for a phase-locked loop, comprising:
a nonlinear first coarse tuner configured to receive an input signal having frequency information, provide a coarse frequency setting, and be operable in an open loop operation;
a second coarse tuner coupled in parallel with the first coarse tuner, and configured to receive the input signal, and perform a change of an operation point of an oscillator or compensate for a frequency offset;
a fine tuner configured to receive the input signal, provide fine adjustments of a frequency of the oscillator, and be operable in a closed loop operation; and
an oscillator output configured to output a signal having a frequency determined by the first coarse tuner, the second coarse tuner, and the fine tuner.

2. The oscillator as claimed in claim 1, wherein the first coarse tuner comprises a first tuning range, the second coarse tuner comprises a second tuning range, the second tuning range being smaller than the first tuning range.

3. The oscillator as claimed in claim 1, wherein the first coarse tuner is configured to set the frequency of the oscillator at first frequency intervals, and wherein the second coarse tuner is configured set the frequency of the oscillator at second frequency intervals, the second frequency intervals being smaller than the first frequency intervals.

4. The oscillator as claimed in claim 1, wherein the fine tuner is configured to compensate temperature drift by the oscillator over a first temperature range; and wherein the second coarse tuner is configured to re-center an operation point of the fine tuner over a second temperature range, the second temperature range being wider than the first temperature range.

5. The oscillator as claimed in claim 1, wherein the second coarse tuner is configured to re-center a tuning frequency of the fine tuner.

6. The oscillator as claimed in claim 1, wherein the first coarse tuner and the second coarse tuner are separate tuning fields.

7. The oscillator as claimed in claim 1, wherein the first coarse tuner and the second coarse tuner are a respective non-linear part and a linear part of a single coarse tuning field.

8. The oscillator as claimed in claim 1, wherein the second coarse tuner is configured to perform a pre-characterization before power-up of the phase-locked loop.

9. The oscillator as claimed in claim 8, wherein the pre-characterization comprises an interpolation.

10. The oscillator as claimed in claim 8, further comprising:
a frequency counter configured to count a reference clock signal over a gate period.

11. The oscillator as claimed in claim 10, wherein the frequency counter is configured to receive a gate signal defining the gate period.

12. The oscillator as claimed in claim 8, wherein the first coarse tuner and the second coarse tuner and the fine tuner are configured to output the signal at the oscillator output as a result of a single frequency measurement post phase-locked loop power up.

13. The oscillator as claimed in claim 1, wherein the oscillator is configured to output a signal based on an alignment algorithm.

14. The oscillator as claimed in claim 13, wherein the alignment algorithm includes at least one of a temperature extension algorithm, a binary search algorithm, and an interpolation algorithm.

15. A phase-locked loop apparatus, comprising:
a time-to-digital converter having a first input configured to receive an input signal and generate a time-to-digital converter output signal;
a loop filter configured to generate a filtered output signal based on the time-to-digital converter output signal;
a digitally controlled oscillator configured to generate a phase-locked loop output signal based on the filtered output signal;
a feedback path coupled between an output of the digitally controlled oscillator and a second input of the time-to-digital converter;
wherein the digitally controlled oscillator includes:
a first coarse tuner configured to provide coarse frequency setting of the oscillator and be operable in an open loop operation, wherein the first coarse tuner is non-linear;
a second coarse tuner coupled in parallel with the first coarse tuner, and configured to perform a change of an operation point of the oscillator or to compensate for a frequency offset, wherein the second coarse tuner is linear;
a fine tuner configured to provide fine adjustments of the frequency of the oscillator, and be operable in a closed loop operation; and
an oscillator output configured to output a signal having a frequency determined by the first coarse tuner, the second coarse tuner, and the fine tuner.

16. The phase-locked loop apparatus as claimed in claim 15, further comprising:
a frequency measurer configured to perform a single open loop frequency measurement after a phase-locked loop power up to compensate for any frequency mismatch using the second coarse tuner;
wherein the oscillator is further configured to settle on a frequency after the single frequency measurement post the phase-locked loop power up.

* * * * *